(12) United States Patent
Hertz (10) Patent No.: US 6,569,248 B1
(45) Date of Patent: May 27, 2003

(54) APPARATUS FOR SELECTIVELY APPLYING SOLDER MASK

(76) Inventor: Allen David Hertz, 12784 Tulipwood Cir., Boca Raton, FL (US) 33428

( * ) Notice: Subject to any disclaimer, the term of this patent is extended or adjusted under 35 U.S.C. 154(b) by 98 days.

(21) Appl. No.: 09/659,209

(22) Filed: Sep. 11, 2000

(51) Int. Cl.[7] .............................................. B05C 21/00
(52) U.S. Cl. ...................... 118/504; 118/505; 118/406; 118/410; 228/39
(58) Field of Search .................................. 118/504, 505, 118/406, 410, 301, 315; 427/282, 96; 228/246, 39, 41, 35

(56) References Cited

U.S. PATENT DOCUMENTS

| | | | |
|---|---|---|---|
| 4,479,983 A | | 10/1984 | Appelt et al. |
| 4,588,468 A | | 5/1986 | McGinty et al. |
| 4,710,399 A | * | 12/1987 | Dennis ........................ 118/410 |
| 4,924,304 A | | 5/1990 | Freeman |
| 4,934,309 A | * | 6/1990 | Ledermann et al. .......... 118/50 |
| 5,107,759 A | | 4/1992 | Omori et al. |
| 5,356,658 A | * | 10/1994 | Hertz et al. .................. 427/96 |
| 5,359,928 A | | 11/1994 | Blessington et al. |
| 6,386,435 B1 | * | 5/2002 | Downes ................. 228/180.22 |

OTHER PUBLICATIONS

A.P.E. Industries Advertisement—Sniper from www.apecorp.com.
OK International Advertisement—BGA Rework System from www.okinternational.com.

* cited by examiner

Primary Examiner—Laura Edwards
(74) Attorney, Agent, or Firm—Allen Hertz (57) ABSTRACT

A method and apparatus are disclosed for applying solder mask to an area respective of a plurality of receiving pads on a Printed Circuit Board. The solder mask can be at least partially removed during the component removal process exposing the conductor, via and annular ring. The exposed conductor, via and annular ring can cause defects and unreliable solder joints should the solder flow along the conductor and into the via. A small stencil can be used to apply solder mask in a desirable pattern to a selective area of a PCB. Alternatively, an elastomeric transferring apparatus can be used. Various methods can be included to assist in aligning the applicator to the desired area such as an overlaid, dual imaging system.

14 Claims, 8 Drawing Sheets

APPARATUS FOR SELECTIVELY APPLYING SOLDER MASK

FIELD OF THE INVENTION

This invention relates in general to the field of rework processes for surface mount technology, and in particular a method and apparatus for reapplying a solder mask material for areas of solder mask that are removed during the component rework process such as those for a Ball Grid Array (BGA).

BACKGROUND OF THE INVENTION

Printed Circuit Boards (PCB's) are manufactured using various additive and subtractive process. The circuitry is generated by starting with a core panel of copper laminated to at least one side of a core material. Generally, the copper is laminated to both sides of the core material. The copper is generally chemically etched using photodeveloping processes and various chemicals to create the circuitry. Several cores are then laminated to create a multilayer PCB. The several cores are drilled in predetermined locations and later plated to create electromechanical connections between the circuits of the various layers, commonly referred to as vias. Solder resist or mask is applied to each outer layer of the laminated PCB, over the bare copper.

Solder mask is required to control the flow of solder and contain the solder to the desired solder pads, respective to each component. This is particularly critical for Ball Grid Array (BGA) devices, whereby the solder pads are attached to a via. The solder is preapplied to the BGA in predefined volumes. During reflow, the solder liquefies and flows around the receiving pads on the PCB. Should the solder mask be removed, when attaching a replacement component, the solder can flow from the receiving pad down the via, resulting in a defect. Defects can include open circuits, mis-registered components, shorts, and reliability risks.

Conventional methods for reworking surface mount components, require heat to remove the component previously reflowed to a Printed Circuit Board (PCB). The heating process degrades the adhesion between the solder mask and the bare copper circuitry. Further, any residual solder needs to be removed from the receiving pads. This is generally completed by placing solder wick (pre-fluxed, braided copper strands woven into a ribbon) against the pads and heating the wick using a soldering iron. The solder wick is known to abrade and remove the solder mask from the PCB. Solder may also flow under the resist and cause the resist to lift from the copper.

The solder mask process is generally applied to the PCB during the PCB fabrication process. The process utilized phototooling and photodeveloping systems. These systems require expensive equipment and a flat surface. These two factors make replacement of the solder mask on a populated assembly at an assembly shop impractical.

It is known to use micro stencils, such as U.S. Pat. No. 5,107,759, Omori, et al. dated Apr. 28, 1992 to apply solder to solder pads for replacement of solder during the rework process.

It is known to use look up/look down prism systems during the alignment process of various solder printing and component placement processes. One known example is taught by Freeman, U.S. Pat. No. 4,924,304, issued May 8, 1990.

Thus, what is necessary is a low cost and efficient method and apparatus for replacing solder mask around pads on a component or on a substrate, where the solder mask has been removed during a rework process.

SUMMARY OF THE INVENTION

One aspect of the present invention is to provide a low cost tool for replacing solder mask or a similar type material onto exposed metallization of a component or PCB.

A second aspect of the present invention is the ability to apply a pattern of solder mask to a desired area, leaving the desired solder pads exposed.

A third aspect of the present invention is a solder mask applicator to apply the pattern of solder mask to the desired area.

A fourth aspect of the present invention is the use of a foil to define the desired pattern.

A fifth aspect of the present invention is the use of a rubber stamp to define the desired pattern.

A sixth aspect of the present invention is the inclusion of a mechanism to aid in registration of the pattern on the solder mask applicator and the receiving site.

A seventh aspect of the present invention is the use of a prism, look up/look down system to align the pattern of the solder mask applicator and the receiving site.

An eighth aspect of the present invention is the use of a predetermined depth, solder mask reservoir to apply the solder mask to the solder mask applicator.

A ninth aspect of the present invention is the incorporation of the present invention into a component rework apparatus, preferably one which comprises a means to provide alignment, a means to control relational proximity between the selective solder mask applicator and the plurality of receiving pads, and a controllable means to apply heat as required.

A tenth aspect of the present invention is the inclusion of a means to at least partially automate the processes described herein, such as including a means to apply a predetermined set of instructions to an automated means.

DETAILED DESCRIPTION OF THE INVENTION

Figure 1:
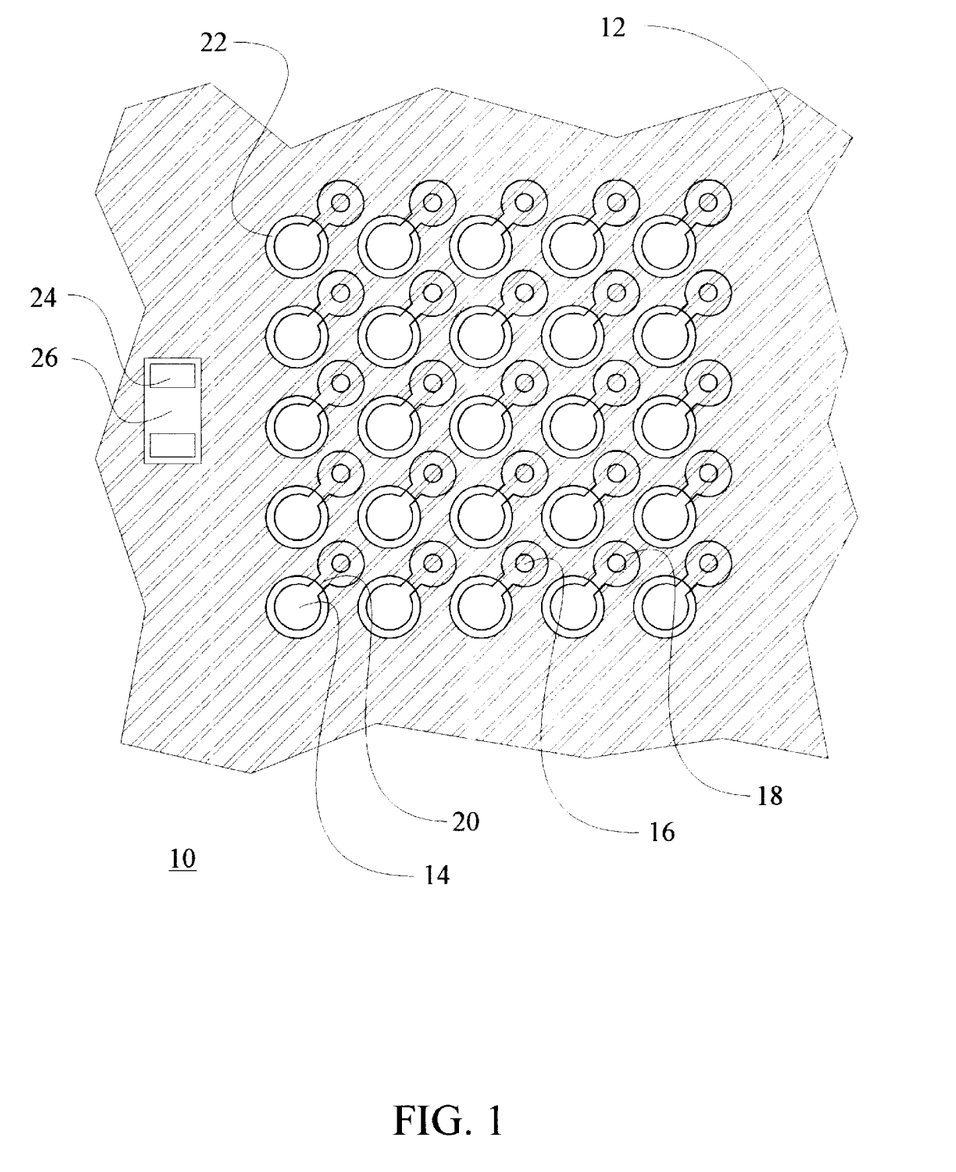
FIG. 1 is a top view of a PCB in the original or desirable state with solder mask in tact.

FIG. 1 illustrates a top view of a section of a Printed Circuit Board (PCB) 10 shown in a preferred state. The Figure illustrates solder mask 12 adhered to the surface of the PCB 10. A Ball Grid Array (BGA) receiving pad solder mask etch-back 22 is included in the layout of the PCB, whereby the BGA receiving pad solder mask etch-back 22 is used to avoid placing solder mask 12 over a plurality of BGA receiving pads 14. The solder mask 12 is preferred to cover a plurality of vias 16, respective plurality of annular rings 18, and respective plurality of conductors 20. The solder mask 12 provides a barrier between a plurality of receiving pads 14 and the plurality of vias 16, respective plurality of annular rings 18, and respective plurality of conductors 20. Component receiving pads 24 and respective Component solder mask etch-back 26 is further illustrated.

Figure 2:
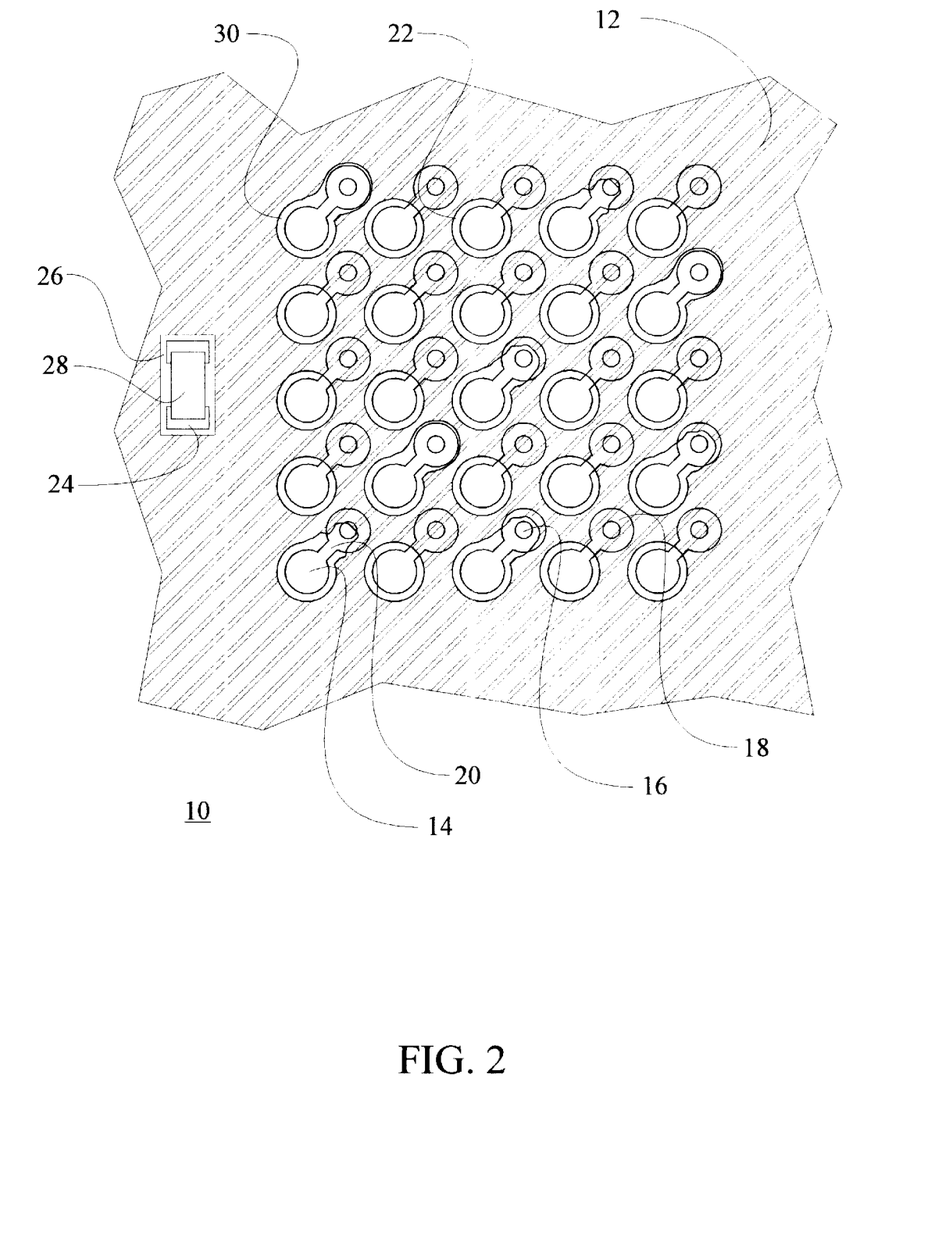
FIG. 2 is a top view of a PCB in a non-desirable state after rework, illustrating removed solder mask.

FIG. 2 illustrates a section of a PCB 10 shown after removal of a BGA component (not shown). During the component removal process and subsequent removal of residual solder on the plurality of BGA receiving pads 14, solder mask 12 can be removed from at least a portion of the plurality of vias 16, respective plurality of annular rings 18, and respective plurality of conductors 20 as shown by the non-desirable exposed areas of copper 30. FIG. 2 further illustrates a component 28 adjacent to the plurality of BGA receiving pads 14 as one would find on a commonly assembled PCB 10. The component 28 limits the available planar surface of the PCB, thus not allowing one to replace the solder mask 12 using the original photo-developing application process. The exposed portion of the plurality of vias 16, respective plurality of annular rings 18, and respective plurality of conductors 20 provides a path for solder to flow during the reflow process. The solder is applied to the BGA receiving pads 14 by any of known methods including the use of the solder spheres applied to the connecting side of the BGA. It is possible and known that the solder can flow along the conductor 20 to the annular ring 18 and down the via 16, resulting in a defect. Further, the variation in resulting joint geometry (not shown) can impact reliability. What is desired is a means to re-apply solder mask to a specific area in a desirable pattern to cover the plurality of vias 16, respective plurality of annular rings 18, and respective plurality of conductors 20, while exposing the BGA receiving pads 14.

Figure 3:
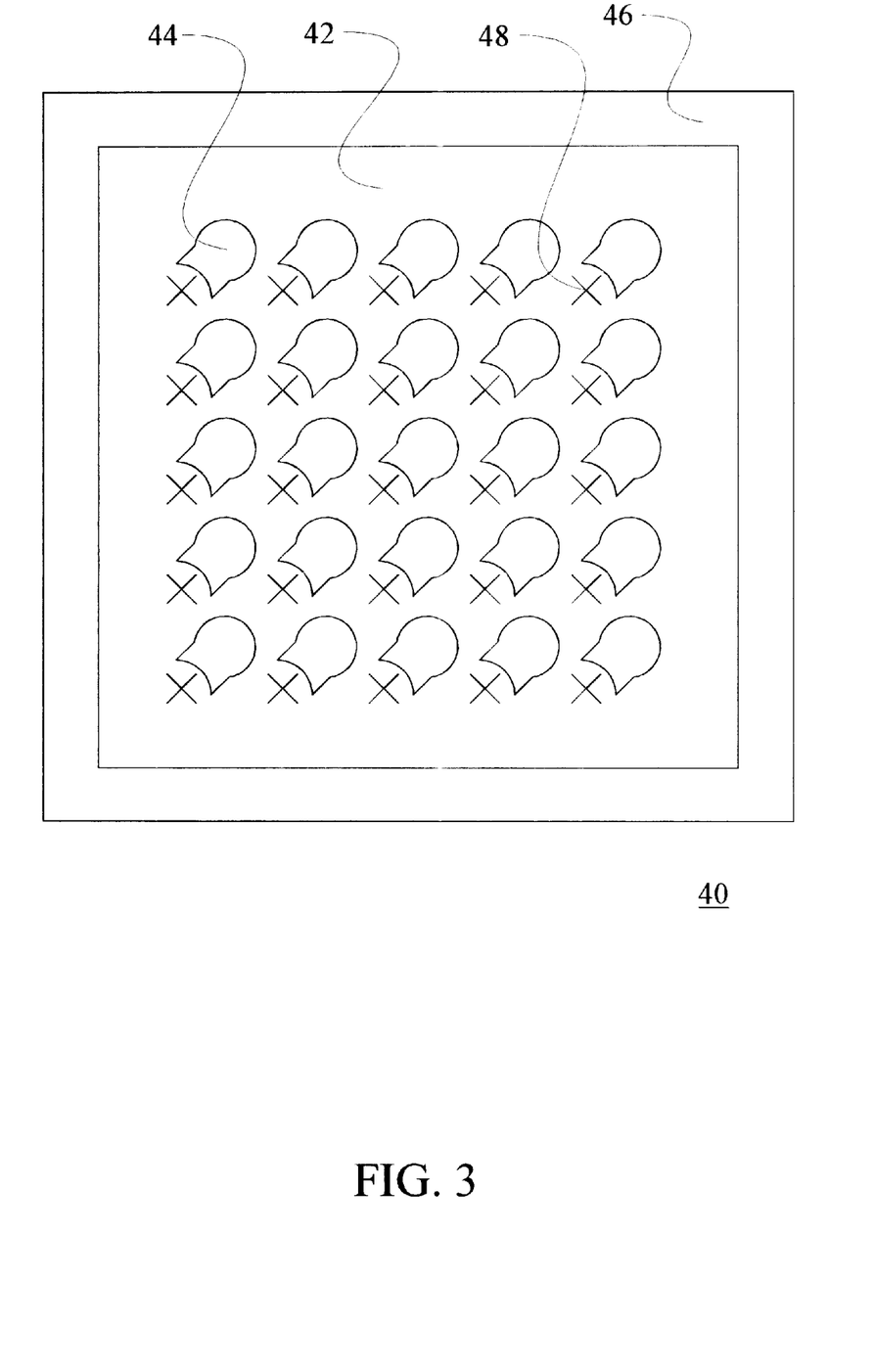
FIG. 3 is a top view of a solder mask applicator using a stencil.

FIG. 3 is top view of a selective solder mask applicator 40. The selective solder mask applicator 40 comprises a masking means 42, a plurality of openings 44, and a stiffening means 46. The selective solder mask applicator 40 can optionally include a means for alignment 48. The masking means 42 can be of an etched metal foil such as a stencil, a silk screen and respective photodeveloped masking, and the like. All of these and other known masking means are well known to those skilled in the art. The stiffening means 46 would be respective to the composition of the masking means 42. The stiffening means 46 can be an extruded or cast frame, bent material if metal is used, and the like. One example of a means for alignment 48 would be to half etch a cross on side of the masking means 42 which contacts the PCB 10. The plurality of openings 44, would be of a pattern which at least covers the plurality of vias 16, respective plurality of annular rings 18, and respective plurality of conductors 20, while exposing the BGA receiving pads 14. The user would align the selective solder mask applicator 40 proximate the BGA receiving pads 14, squeegee solder mask 12 (or similar material) in its liquid form across the masking means, remove the selective solder mask applicator 40 from the PCB 10, and lastly cure the applied solder mask 12. Once the BGA site is prepared, the BGA can be replaced with confidence.

Figure 4:
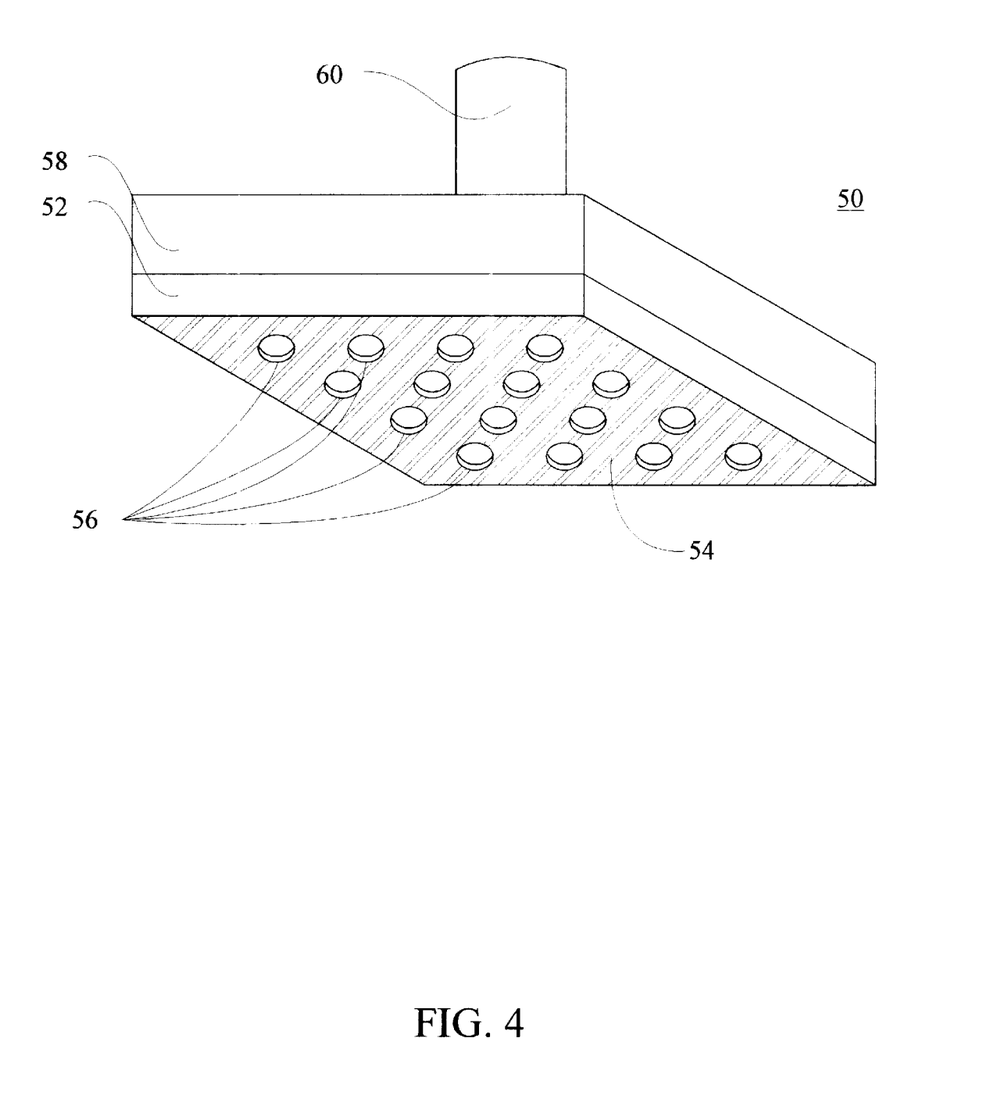
FIG. 4 is an isometric view of a solder mask applicator using a rubber stamp.

FIG. 4 is all isometric view cuff an alternate selective solder mask applicator 50. The alternate selective solder mask applicator 50 comprises a formed section of elastomeric material 52. The elastomeric material 52 can be coupled to a backing material 58 to add rigidity. The elastomeric material 52 is formed to provide a transferring surface 54 and a plurality of cavities 56, similar to that of a rubber stamp. The combination of a transferring surface 54 and plurality of cavities 56 creates a desirable pattern to transfer solder mask which at least covers the plurality of vias 16, respective plurality of annular rings 18, and respective plurality of conductors 20, while exposing the BGA receiving pads 14. Solder mask 12 would be transferred from a reservoir (not shown) to the transferring surface 54 of the alternate selective solder mask applicator 50. The alternate selective solder mask applicator 50 is held by a holding means 60 and located proximate the BGA receiving pads. The solder mask 12 would be deposited onto the PCB 10. The solder mask 12 would be cured. Once the BGA site is prepared, the BGA can be replaced with confidence.

The alternate selective solder mask applicator 50 can be manufactured using any known technology similar to that of making a felt tipped marker or a rubber stamp. The transferring surface 54 may further include texturing or smaller recesses to aid in the transferring process of the solder mask 12.

Since the surface of the PCB 10 is known to be non-planar, it is advantageous to use a compliant, elastomeric material 52 as a transferring mechanism.

Figure 5:
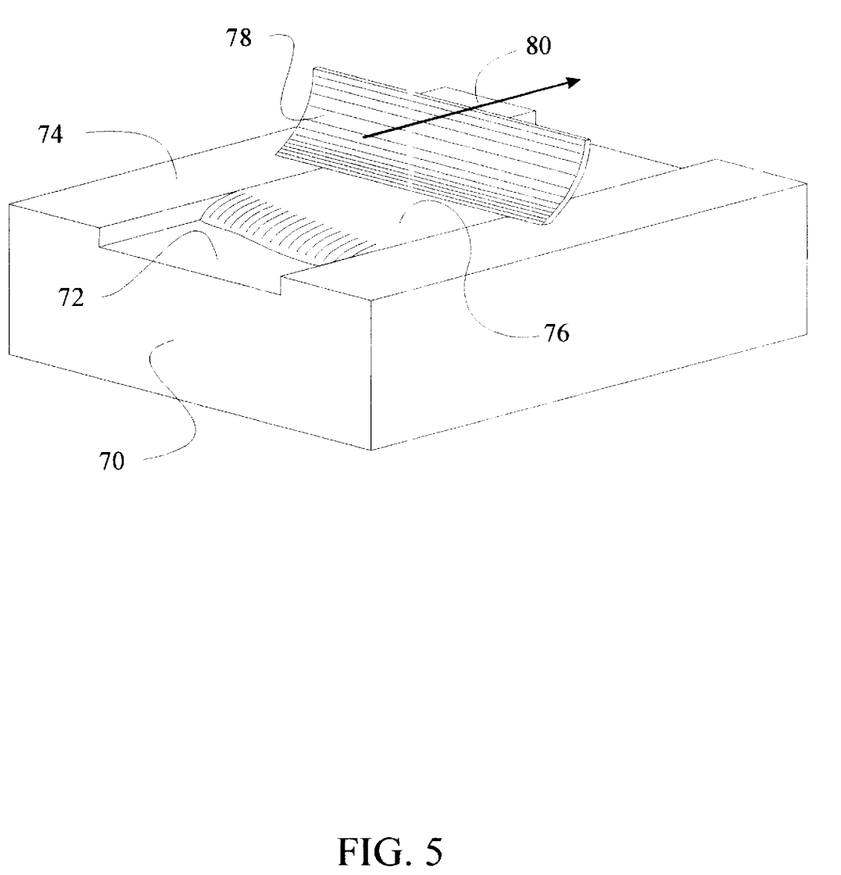
FIG. 5 is an isometric view of a solder mask reservoir for use in conjunction with the solder mask applicator of FIG. 4.

FIG. 5 is an isometric view of a sample solder mask reservoir 70. A solder mask reservoir can be defined as anything capable of holding uncured solder mask 76 in a manner capable of applying a desired thickness to the transferring surface 54 of the selective solder mask applicator 50. The figure illustrates a reservoir block 70 which can be machined to include a first top surface 74 and a second, recessed surface or trough 72. The trough can be milled to a desirable depth, whereby uncured solder mask 76 can be deposited in the trough 72 and leveled by passing 80 a squeegee 78 or similar across the top or leveling surface 74 of the reservoir block 70. The solder mask can be of solder mask material, chip bonder, epoxy, and the like. Once the solder mask is applied, it can then be cured a manner respective to the selected material.

Figure 6:
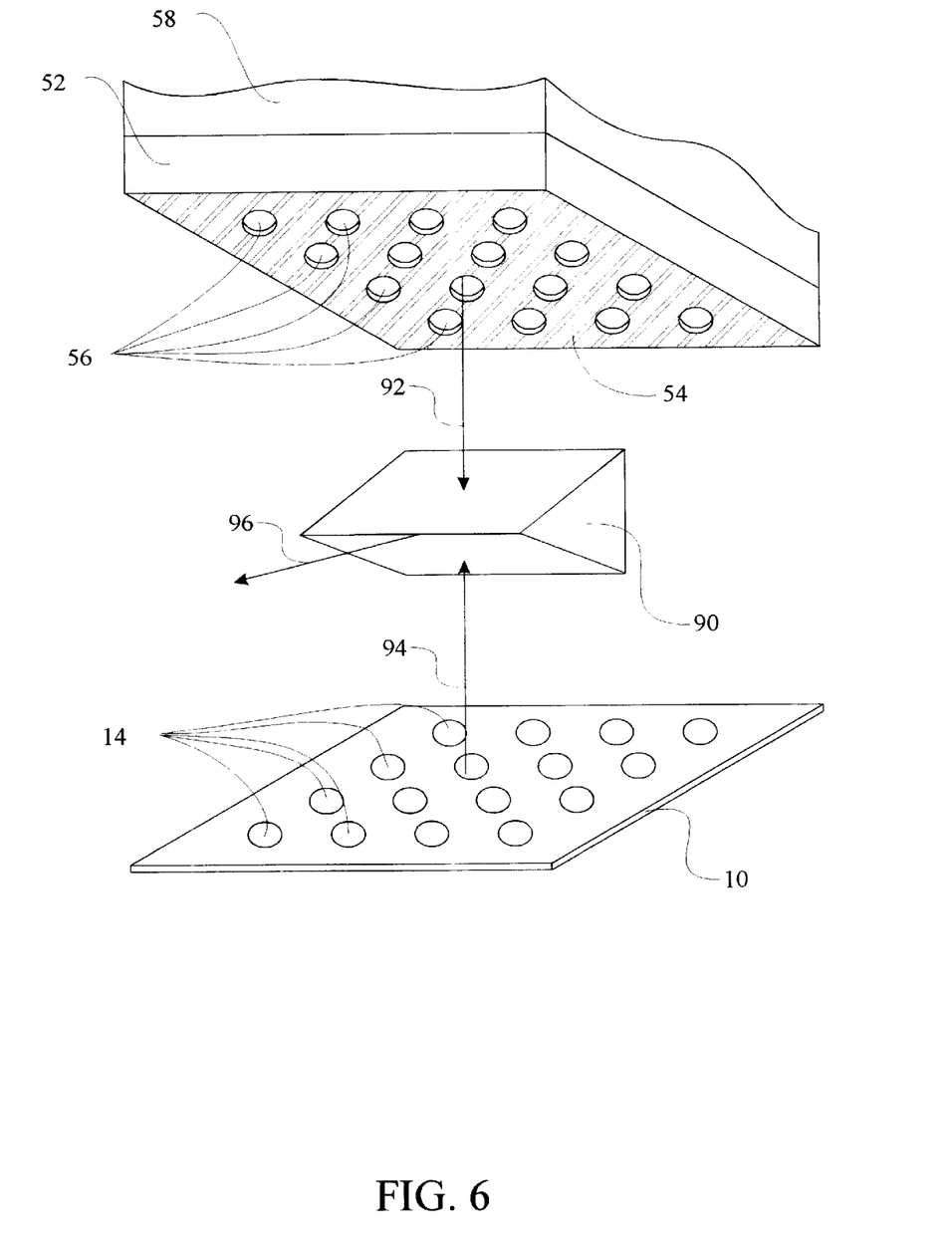
FIG. 6 is an isometric view illustrating one potential alignment apparatus using an imaging system.

FIG. 6 is an isometric view of a sample solder mask applicator 50 in relation with a plurality of electronic pads 14 located on a section of PCB 10. The figure illustrates a method of aligning the sample solder mask applicator 50 and the plurality of electronic pads 14 located on a section of PCB 10. Although the figure illustrates one method, it can be recognized that numerous known means of aligning the sample solder mask applicator 50 and the plurality of electronic pads 14 located on a section of PCB 10 can be used. In accordance with a preferred embodiment, an alignment system utilizes an image splitter 90 to superimpose a first image 92 of the sample solder mask applicator 50 and a second image 94 of the plurality of electronic pads 14 to get an overlaid image 96. The alignment system would include a mechanism to adjust the relation of the applicator 50 and the pads 14, preferably including a coarse and a fine adjustment means. Once aligned, the apparatus would further comprise a means to remove the imaging system from between the applicator 50 and the pads 14, then a means to bring the applicator 50 and the pads 14 in contact without affecting the relational alignment of the two. The apparatus would also provide a means to separate the applicator 50 and the pads 14, thus transferring the solder mask 76 (applied to the transferring surface 54) to the surface of the PCB 10, without applying solder mask 76 to the plurality of electronic pads 14.

Figure 7:
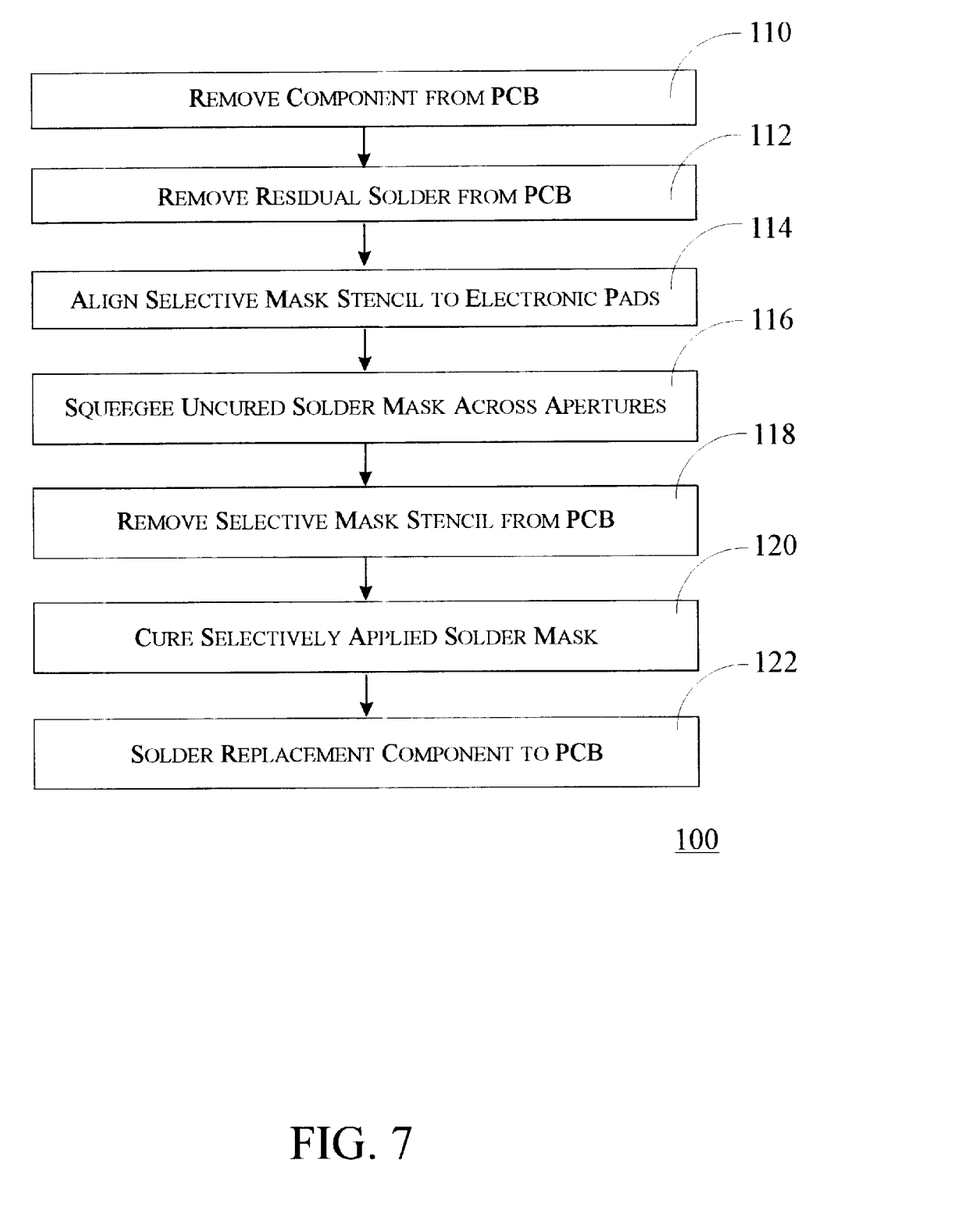
FIG. 7 is a flow diagram illustrating a process of applying solder mask to a PCB using a stencil.

FIG. 7 is a flow diagram illustrating a method 100 for applying selective solder mask to a PCB using a stencil. In a first step 110, the component (not shown) is removed from the assembled PCB 10. The removal process can be of any known removal methods, such as convection rework processes, where hot air is blown through a nozzle onto the component. In a second step 112, any residual solder (not shown) is removed from the plurality of electronic pads 14. The residual solder can be removed by applying conductive heat through solder wick to transfer the residual solder to the solder wick. This process is required to maintain a repeatable volume of solder within the resulting solder joints upon completion of the component replacement process. It can be recognized that there are numerous methods for removing components and residual solder which should not impose limitations to the present invention. In a third step 114, a selective solder mask applicator 40 is located to a desirable location with respect to the plurality of electronic pads 14. This can be accomplished by any number of methods, including those illustrated in FIG. 6, visual alignment through the apertures, and the like. In a fourth step 116, uncured solder mask would be applied to the exposed surface of the selective solder mask applicator 40; the solder mask is passed across the plurality of apertures 44 using a squeegee or similar; and thus be transferred in a desired, selective pattern to the PCB 10. In a fifth step 118, the selective solder mask applicator 40 is removed from the PCB 10, leaving the desired, selective pattern of uncured solder mask on the PCB 10. In a sixth step 120, the desired, selective pattern of uncured solder mask is cured using a curing method respective to the said solder mask. One example would be to apply heat to a heat curing material such as Loctite™ chip bonder. In a seventh step 122, a replacement component is attached to the PCB using a respective attachment process. For the example of a BGA, the component can be dipped into a predetermined thickness of flux, placed onto the plurality of receiving pads 14, and heated using convection heating to cause solder balls which are pre-attached to the component to become liquidous and create electro-mechanical interconnections between the component and the plurality of electronic pads 14.

Figure 8:
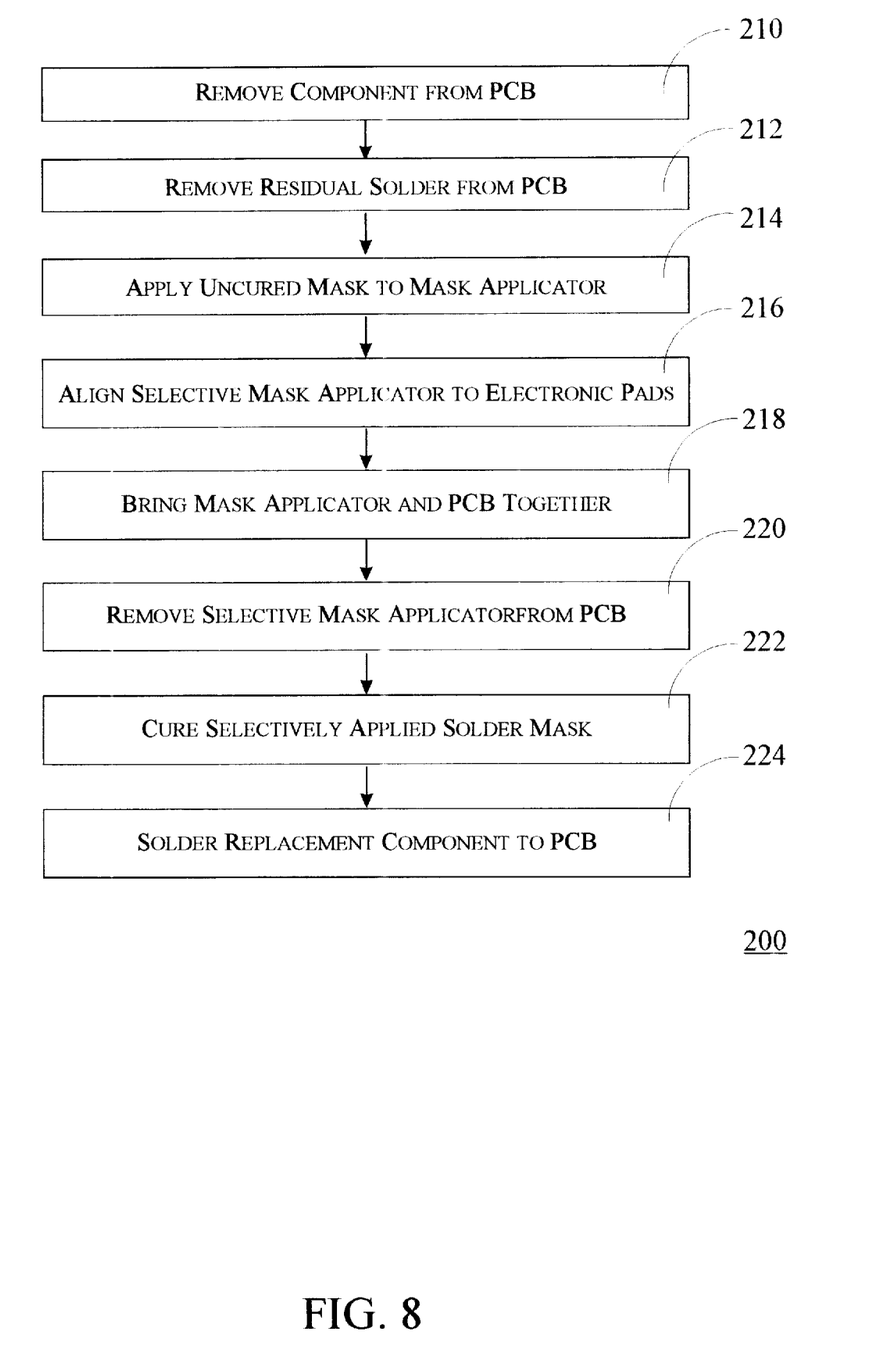
FIG. 8 is a flow diagram illustrating a process of applying solder mask to a PCB using a transfer mechanism such as a rubber stamp.

FIG. 8 is a flow diagram illustrating a method 200 for applying selective solder mask to a PCB using a transfer mechanism such as a rubber stamp. In a first step 210, the component (not shown) is removed from the assembled PCB 10. The removal process can be of any known removal methods, such as convection rework processes, where hot air is blown through a nozzle onto the component. In a second step 212, any residual solder (not shown) is removed from the plurality of electronic pads 14. The residual solder can be removed by applying conductive heat through solder wick to transfer the residual solder to the solder wick. This process is required to maintain a repeatable volume of solder within the resulting solder joints upon completion of the component replacement process. It can be recognized that there are numerous methods for removing components and residual solder which should not impose limitations to the present invention. In a third step 214, uncured solder mask is applied to the selective solder mask applicator 50. This can be accomplished by subjecting the contacting face 54 of the selective solder mask applicator 50 to a reservoir such as the trough 72 of the machined block 70. It can be recognized that there are many other methods of presenting uncured solder mask to the selective solder mask applicator 50. In a fourth step 216, the selective solder mask applicator 40 is located to a desirable location with respect to the plurality of receiving pads 14. This can be accomplished by any number of methods, including those illustrated in FIG. 6, visual alignment from the edge of the applicator 50, and the like. In a fifth step 218, uncured solder mask would be transferred in a desired, selective pattern to the PCB 10. In a sixth step 220, the selective solder mask applicator 50 is removed from the PCB 10, leaving the desired, selective pattern of uncured solder mask on the PCB 10. In a seventh step 222, the desired, selective pattern of uncured solder mask is cured using a curing method respective to the said solder mask. One example would be to apply heat to a heat curing material such as Loctite™ chip bonder. In an eighth step 224, a replacement component is attached to the PCB using a respective attachment process. For the example of a BGA, the component can be dipped into a predetermined thickness of flux, placed onto the plurality of receiving pads 14, and heated using convection heating to cause solder balls which are pre-attached to the component to become liquidous and create electro-mechanical interconnections between the component and the plurality of electronic pads 14.

Various changes may be made to the embodiments shown herein without departing from the scope of the present invention which is limited only by the following claims.

What is claimed is:

1. An apparatus for selectively applying solder, the apparatus comprising:
    a pattern application member comprising a stencil with a pattern for selectively applying solder mask,
    the pattern consisting of a first area used for applying a masking material and a second area which does not transfer masking material, whereby the second area emulates a pattern of electronic pads on a printed circuit board, and whereby the pattern of the first area and the second area are respective to at least one of a single component or a single array pattern, and
    whereby the pattern further comprises half-etched markings for assistance with alignment of the selective pattern application member and the plurality of electronic pads.

2. The apparatus of claim 1 further comprising:
    a pattern application affixing mechanism,
    a printed circuit board assembly affixing mechanism, and
    a registration mechanism to control the relational proximity of the pattern application member and the plurality of electronic pads on the printed circuit board.

3. An apparatus for selectively applying solder mask, the apparatus comprising:
    a pattern application member comprising a pattern for selectively applying solder mask,
    the pattern application member comprising a transferring surface used for transferring a masking material and a plurality of non-transferring recesses, wherein the plurality of non-transferring recesses at least emulates a pattern of electronic pads on a printed circuit board, and whereby the transferring surface and the plurality of non-transfer recesses are respective to at least one of a single component or a single array pattern.

4. The apparatus of claim 3, wherein the transferring surface and a plurality of non-transferring recesses are of an elastomeric material.

5. The apparatus of claim 4, wherein the transferring surface further comprises at least one of texturing and recessions to enhance a transferring process.

6. The apparatus of claim 3, wherein the transferring surface and a plurality of non-transferring recesses are of a material comprising a matted, compressed fiber.

7. The apparatus of claim 3, the apparatus further comprising a reservoir to apply uncured solder mask onto the transferring surface of the pattern application member.

8. The apparatus of claim 7, whereby the reservoir comprises a substantially flat surface at a first height and a substantially flat second surface at a desirable, second height to provide a predetermined thickness of uncured solder mask.

9. An apparatus for selectively applying solder mask, the apparatus comprising:
- a pattern application member comprising a pattern for selectively applying solder mask,
- the pattern application member comprising a transferring surface used for transferring a masking material and a plurality of non-transferring recesses, wherein the plurality of non-transferring recesses at least emulate a pattern of electronic pads on a printed circuit board, and whereby the pattern of the transferring surface and the plurality of non-transfer recesses are respective to at least one of a single component or a single array pattern,
- a pattern application affixing mechanism,
- a printed circuit board assembly affixing mechanism, and
- a registration mechanism to control the relational proximity of the pattern application member and the plurality of electronic pads on a printed circuit assembly.

10. A The selective solder mask applicator of claim 9, wherein the transferring surface and a plurality of non-transferring recesses are of an elastomeric material.

11. The selective solder mask applicator of claim 10, wherein the transferring surface further comprises at least one of texturing and recessions to enhance the transferring process.

12. The selective solder mask applicator of claim 9, wherein the transferring surface and a plurality of non-transferring recesses are of a material comprising a matted, compressed fiber.

13. The selective solder mask applicator of claim 9, the applicator further comprising a reservoir to apply uncured solder mask onto the transferring surface of the selective solder mask applicator.

14. The selective solder mask applicator of claim 13, whereby the reservoir comprises a substantially flat surface at a first height and a substantially flat second surface at a desirable, second height to provide a predetermined thickness of uncured solder mask.

* * * * *